(12) United States Patent
Lee

(10) Patent No.: US 11,322,162 B2
(45) Date of Patent: May 3, 2022

(54) METHOD AND APPARATUS FOR RESAMPLING AUDIO SIGNAL

(71) Applicant: RAZER (ASIA-PACIFIC) PTE. LTD., Singapore (SG)

(72) Inventor: Kah Yong Lee, Singapore (SG)

(73) Assignee: RAZER (ASIA-PACIFIC) PTE. LTD., Singapore (SG)

( * ) Notice: Subject to any disclaimer, the term of this patent is extended or adjusted under 35 U.S.C. 154(b) by 0 days.

(21) Appl. No.: 16/757,698

(22) PCT Filed: Nov. 1, 2017

(86) PCT No.: PCT/SG2017/050551
§ 371 (c)(1),
(2) Date: Apr. 20, 2020

(87) PCT Pub. No.: WO2019/088915
PCT Pub. Date: May 9, 2019

(65) Prior Publication Data
US 2021/0201921 A1 Jul. 1, 2021

(51) Int. Cl.
*G10L 19/005* (2013.01)
*G10L 21/02* (2013.01)
(52) U.S. Cl.
CPC ............ *G10L 19/005* (2013.01); *G10L 21/02* (2013.01)
(58) Field of Classification Search
CPC .............................. G10L 19/005; G10L 21/02
See application file for complete search history.

(56) References Cited

U.S. PATENT DOCUMENTS

| 5,892,694 A | 4/1999 | Ott |
| 6,510,182 B1 | 1/2003 | Lee et al. |

(Continued)

FOREIGN PATENT DOCUMENTS

| EP | 2355387 A1 * | 8/2011 | ............ H04J 3/0632 |
| EP | 2314000 B1 | 4/2015 | |

(Continued)

OTHER PUBLICATIONS

International Search Report and Written Opinion, dated Oct. 25, 2018, for the corresponding International Application No. PCT/SG2017/050551 in 10 pages.

(Continued)

*Primary Examiner* — Bryan S Blankenagel
(74) *Attorney, Agent, or Firm* — Polsinelli PC

(57) ABSTRACT

A method, a computer-readable medium, and an apparatus for resampling audio signal are provided. The apparatus resamples the audio signal in order to preserve the audio playback quality when dealing with audio playback overrun and underrun problem. The apparatus may receive a data block of the audio signal including a first number of samples. For each sample of the first number of samples, the apparatus may slice a portion of the audio signal corresponding to the sample into a particular number of sub-samples. The apparatus may resample the data block of the audio signal into a second number of samples based on the first number of samples and the particular number of sub-samples associated with each sample of the first number of samples. The apparatus may play back the resampled data block of the audio signal via an electroacoustic device.

15 Claims, 13 Drawing Sheets

(56) References Cited

U.S. PATENT DOCUMENTS

| | | | |
|---|---|---|---|
| 7,345,600 B1 * | 3/2008 | Fedigan | H03H 17/028 |
| | | | 341/61 |
| 7,370,125 B2 | 5/2008 | Bogin et al. | |
| 7,518,053 B1 * | 4/2009 | Jochelson | G10H 1/40 |
| | | | 84/603 |
| 7,634,227 B2 | 12/2009 | de Jong | |
| 7,953,491 B1 | 5/2011 | Hartley | |
| 7,974,838 B1 * | 7/2011 | Lukin | G10L 21/04 |
| | | | 704/207 |
| 8,542,786 B2 | 9/2013 | Wei | |
| 9,661,425 B2 | 5/2017 | Solum et al. | |
| 2002/0085489 A1 | 7/2002 | Sartain et al. | |
| 2007/0191976 A1 * | 8/2007 | Ruokangas | G10H 3/186 |
| | | | 700/94 |
| 2009/0135976 A1 | 5/2009 | Ramakrishnan et al. | |
| 2009/0259671 A1 | 10/2009 | Garudadri et al. | |
| 2010/0002683 A1 | 1/2010 | Miljkovic et al. | |
| 2011/0313553 A1 * | 12/2011 | Gimenez | G10L 19/005 |
| | | | 700/94 |
| 2012/0047113 A1 * | 2/2012 | Weinberger | H03M 7/40 |
| | | | 707/693 |
| 2012/0274512 A1 * | 11/2012 | Jokitalo | G01S 19/30 |
| | | | 342/357.69 |
| 2016/0180860 A1 | 6/2016 | Wang | |
| 2016/0234088 A1 * | 8/2016 | Kruger | H04L 7/0029 |
| 2016/0316302 A1 | 10/2016 | Zhang et al. | |
| 2017/0064651 A1 | 3/2017 | Volkov et al. | |
| 2018/0184389 A1 * | 6/2018 | Gentili | H04W 56/0035 |

FOREIGN PATENT DOCUMENTS

| | | | | |
|---|---|---|---|---|
| JP | 2004 264497 A | | 9/2004 | |
| JP | 2005-303831 A | | 10/2005 | |
| WO | WO-2015039691 A1 * | | 3/2015 | H04J 3/0632 |

OTHER PUBLICATIONS

Madapura, Jayanth, "Low-Cost Digital Audio Playback Doesn't Have To Compromise Quality", Electronic Design; Jul. 27, 2011 (http://www.electronicdesign.com/embedded/low-cost-digital-audio-playback-doesn-t-have-compromise-quality) in 8 pages.

Akester, Richard, et al. "A New Audio Skew Detection and Correction Algorithm", Department of Computer Science, University College London, (Aug. 2002). Multimedia and Expo, 2002. ICME'02. Proceedings. 2002 IEEE International Conference on. vol. 2. IEEE, 2002. (https://pdfs.semanticscholar.org/a9fa/36a44ac0b21690614d1888db9f1d572b4cfb.pdf).

Extended European Search Report dated Sep. 2, 2020, 8 pages, for the corresponding European Patent Application No. 17930963.8.

* cited by examiner

METHOD AND APPARATUS FOR RESAMPLING AUDIO SIGNAL

TECHNICAL FIELD

Various aspects of this disclosure generally relate to audio signal processing, and more particularly, to resampling audio signal in order to preserve the audio playback quality when dealing with audio playback overrun and underrun problem.

BACKGROUND

In a wireless speaker and wireless headset system, audio signal is transmitted wirelessly from a host (e.g., personal computer, game console) to a receiver device (e.g., speaker, headset). However, the host and the receiver device may use independent clocking system for their digital circuit operations, hence the audio acquisition rate at the host system may be slightly different from the audio playback rate at the receiver device. Audio playback overrun or underrun will happen when the accumulation of clock offset is greater than an audio sample period. In a traditional system design, excess audio data is dropped when audio playback overrun happens in the receiver device, whereas the last audio data is repeated when an audio playback underrun occurs. Nevertheless, the audio playback qualify is compromised when audio playback overrun or underrun happens.

SUMMARY

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its sole purpose is to present some concepts of one or more aspects in a simplified form as a prelude to the more detailed description that is presented later.

In an aspect of the disclosure, a method, a computer-readable medium, and an apparatus for resampling audio signal are provided. The apparatus resamples the audio signal in order to preserve the audio playback quality when dealing with audio playback overrun and underrun problem. The apparatus may receive a data block of the audio signal including a first number of samples. For each sample of the first number of samples, the apparatus may slice a portion of the audio signal corresponding to the sample into a particular number of sub-samples. The apparatus may resample the data block of the audio signal into a second number of samples based on the first number of samples and the particular number of sub-samples associated with each sample of the first number of samples. The apparatus may play back the resampled data block of the audio signal via an electroacoustic device.

To the accomplishment of the foregoing and related ends, the one or more aspects include the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

DETAILED DESCRIPTION

Figure 1:
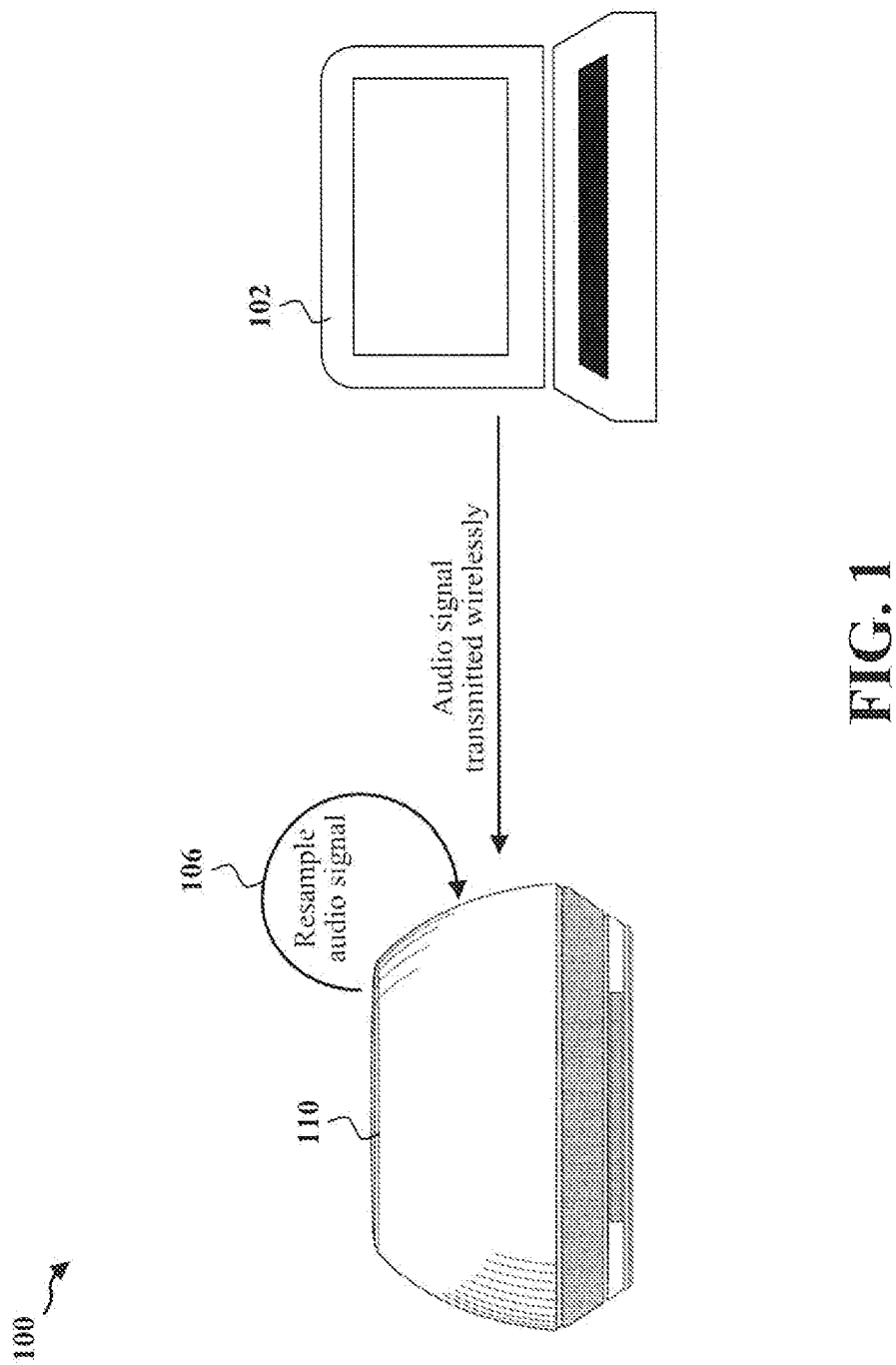
FIG. 1 is a diagram illustrating an example of a system in accordance with some embodiments of the disclosure.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

Several aspects of audio signal processing will now be presented with reference to various apparatus and methods. These apparatus and methods will be described in the following detailed description and illustrated in the accompanying drawings by various blocks, components, circuits, processes, algorithms, etc. (collectively referred to as "elements"). These elements may be implemented using electronic hardware, computer software, or any combination thereof. Whether such elements are implemented as hardware or software depends upon the particular application and design constraints imposed on the overall system.

By way of example, an element, or any portion of an element, or any combination of elements may be implemented as a "processing system" that includes one or more processors. Examples of processors include microprocessors, microcontrollers, graphics processing units (GPUs), central processing units (CPUs), application processors, digital signal processors (DSPs), reduced instruction set computing (RISC) processors, systems on a chip (SoC), baseband processors, field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software components, applications, software applications, software packages, routines, subroutines, objects, executables, threads of execution, procedures, functions, etc., whether referred to as software, firmware, middleware, microcode, hardware description language, or otherwise.

Accordingly, in one or more example embodiments, the functions described may be implemented in hardware, software, or any combination thereof. If implemented in software, the functions may be stored on or encoded as one or more instructions or code on a computer-readable medium. Computer-readable media includes computer storage media. Storage media may be any available media that can be accessed by a computer. By way of example, and not limitation, such computer-readable media may include a random-access memory (RAM), a read-only memory (ROM), an electrically erasable programmable ROM (EEPROM), optical disk storage, magnetic disk storage, other magnetic storage devices, combinations of the aforementioned types of computer-readable media, or any other medium that can be used to store computer executable code in the form of instructions or data structures that can be accessed by a computer.

FIG. 1 is a diagram illustrating an example of a system 100 in accordance with some embodiments of the disclosure. In the example, the system 100 may include a host device 102 and a receiver device 110. The host device 102 may transmit an audio signal to the receiver device 110 wirelessly, e.g., through a short-range wireless communication channel. The short-range wireless communication channel may use Bluetooth, Wi-Fi, or other short-range wireless communication protocol to transmit the audio signal.

The host device 102 may be a desktop computer, a laptop computer, a game console, a smartphone, a tablet computer, or a similar computing device. The receiver device 110 may include a speaker, a headset, a headphone, or any other electroacoustic device. The host device 102 may use a first clocking system for its digital circuit operations; and the receiver device 110 may use a second clocking system for its digital circuit operations. The first clocking system and the second clocking system may be independent of each other. Therefore, the audio acquisition rate at the host device 102 may be slightly different from the audio playback rate at the receiver device 110, resulting in audio playback overrun or underrun. In one embodiment, when audio playback overrun or underrun happens in the receiver device 110, the receiver device 110 may resample (at 106) the audio signal received from the host device 102.

Audio playback underrun and overrun issue may be caused by clock synchronization between the host device 102 and the receiver device 110. Audio distortion may occur at the playback signal of the receiver device 110 when audio playback underrun and overrun problem happens.

Figure 2:
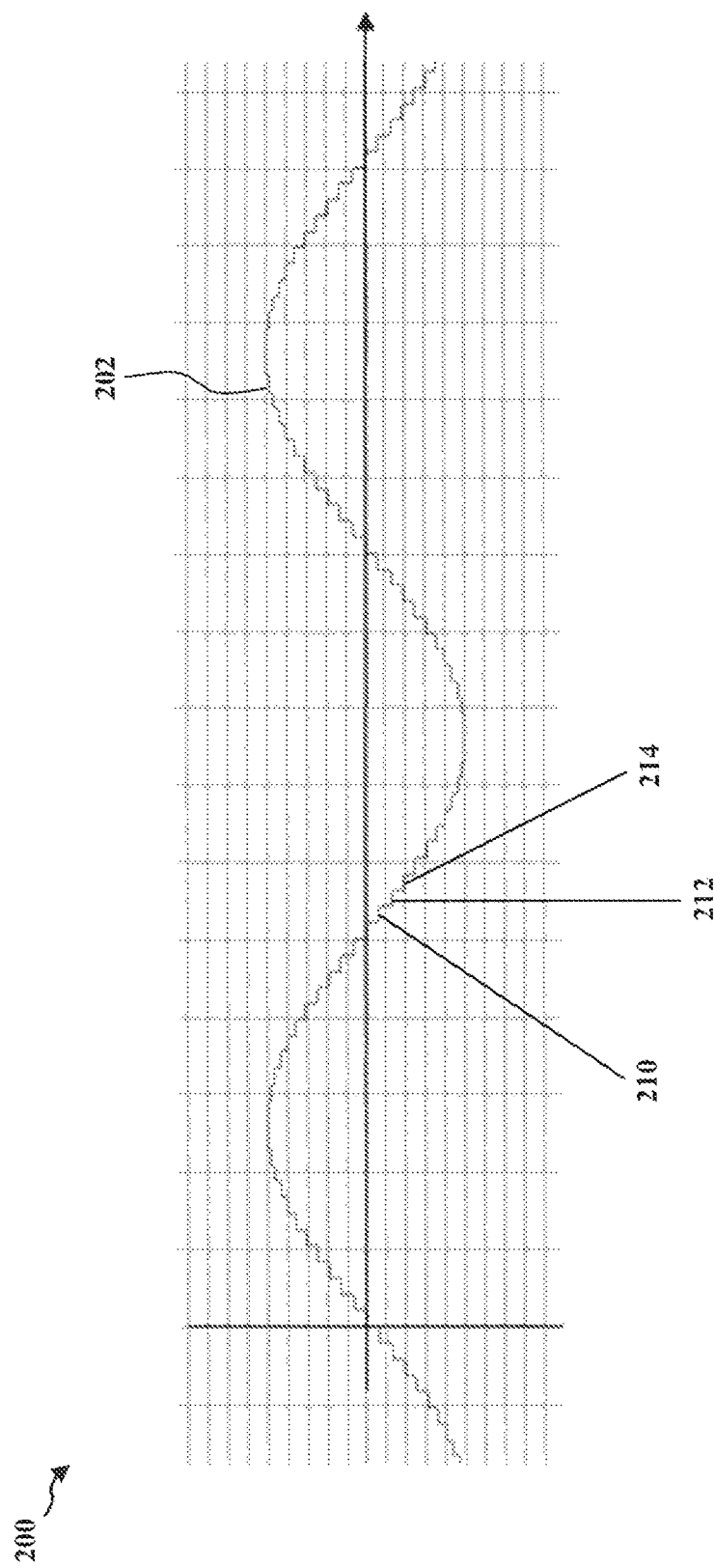
FIG. 2 is a diagram illustrating an example of a waveform of an audio playback signal that is not subject to the audio playback underrun or overrun issue.

FIG. 2 is a diagram 200 illustrating an example of a waveform 202 of an audio playback signal that is not subject to the audio playback underrun or overrun issue. The waveform 202 may be a 1 KHz sinusoidal wave sampling at 48 KHz. As illustrated, any pair of consecutive samples (e.g., samples 210 and 212, or samples 212 and 214) of the waveform 202 transits smoothly from one sample of the pair to the other sample of the pair.

Figure 3:
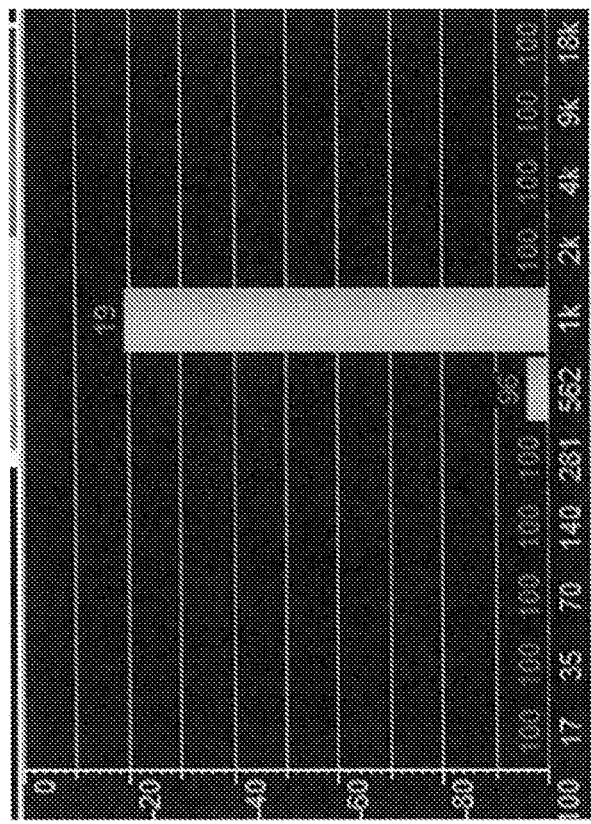
FIG. 3 is a diagram illustrating the frequency response of the audio playback signal in FIG. 2.

FIG. 3 is a diagram 300 illustrating the frequency response of the audio playback signal in FIG. 2. As shown, the frequency response is concentrated on the 1 KHz frequency and there is little noise on other frequencies.

Figure 4:
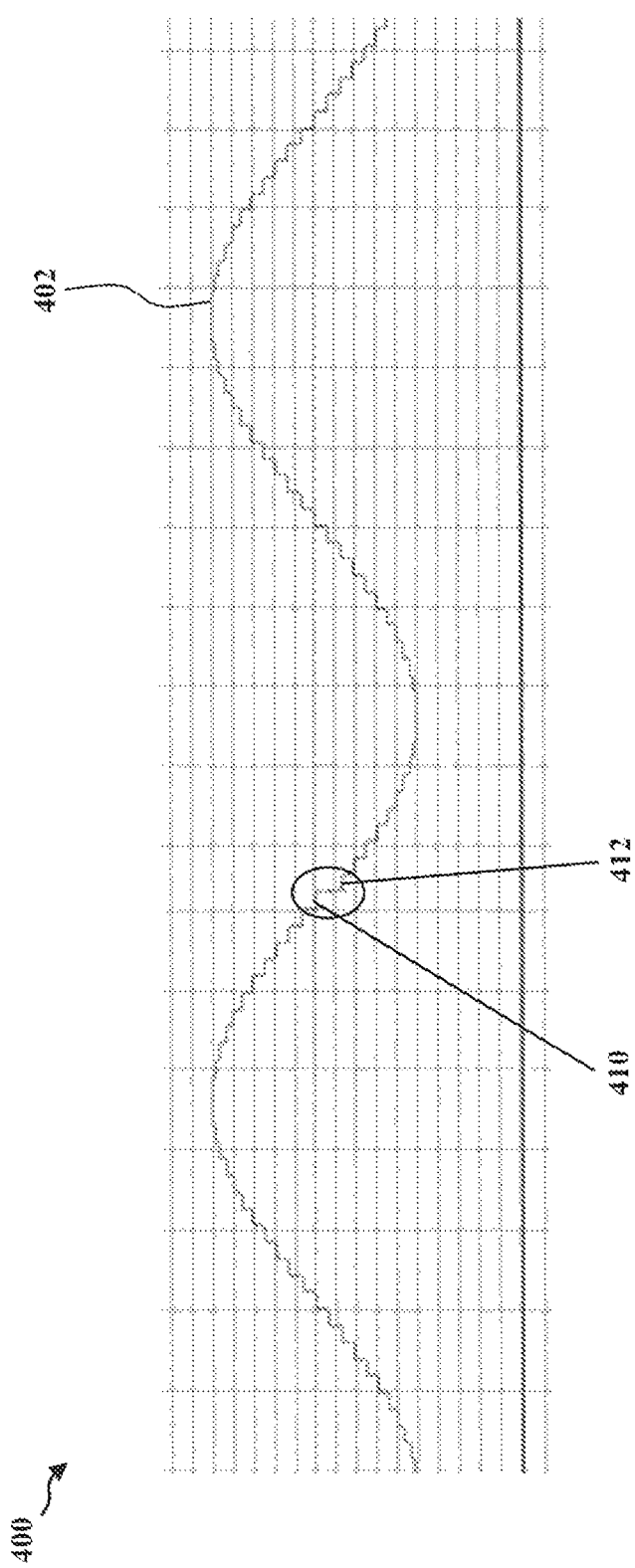
FIG. 4 is a diagram illustrating an example of a waveform of a distorted audio playback signal that is subject to the audio playback overrun issue.

FIG. 4 is a diagram 400 illustrating an example of a waveform 402 of a distorted audio playback signal that is subject to the audio playback overrun issue. The waveform 402 may be a 1 KHz sinusoidal wave sampling at 48 KHz. As illustrated, consecutive audio samples 410 and 412 of the audio playback signal are disjoint. This is because an audio sample in the original audio signal (the sample originally between the samples 410 and 412) is dropped when audio playback overrun happens as the receiver device's clock is slower than the host device.

Figure 5:
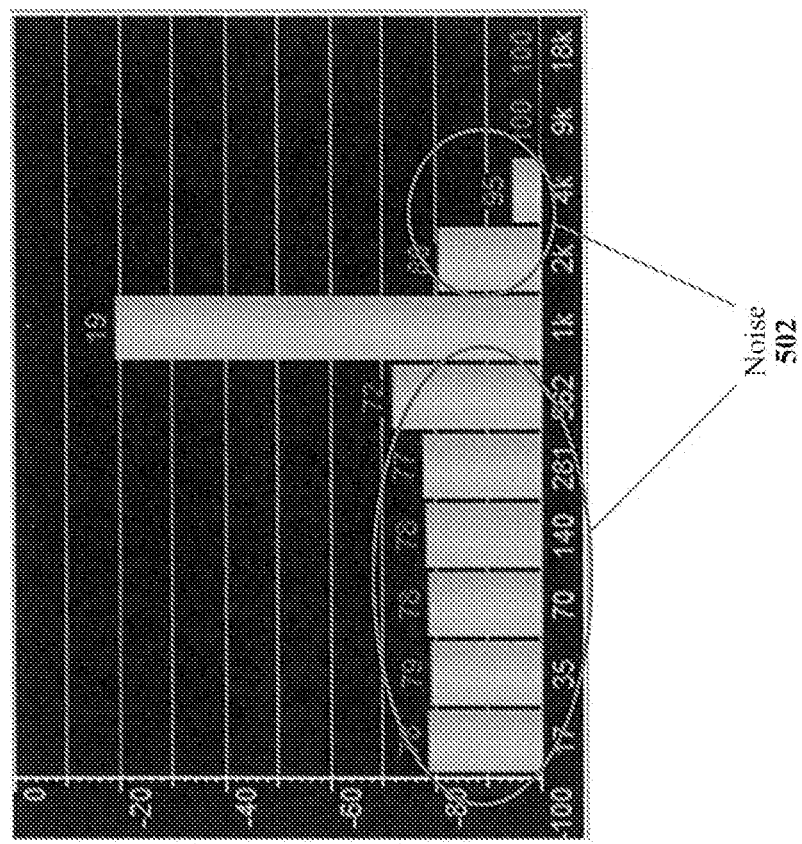
FIG. 5 is a diagram illustrating the frequency response of the distorted audio playback signal in FIG. 4.

FIG. 5 is a diagram 500 illustrating the frequency response of the distorted audio playback signal in FIG. 4. As shown, the frequency response of the distorted audio playback signal has substantial noise 502.

Figure 6:
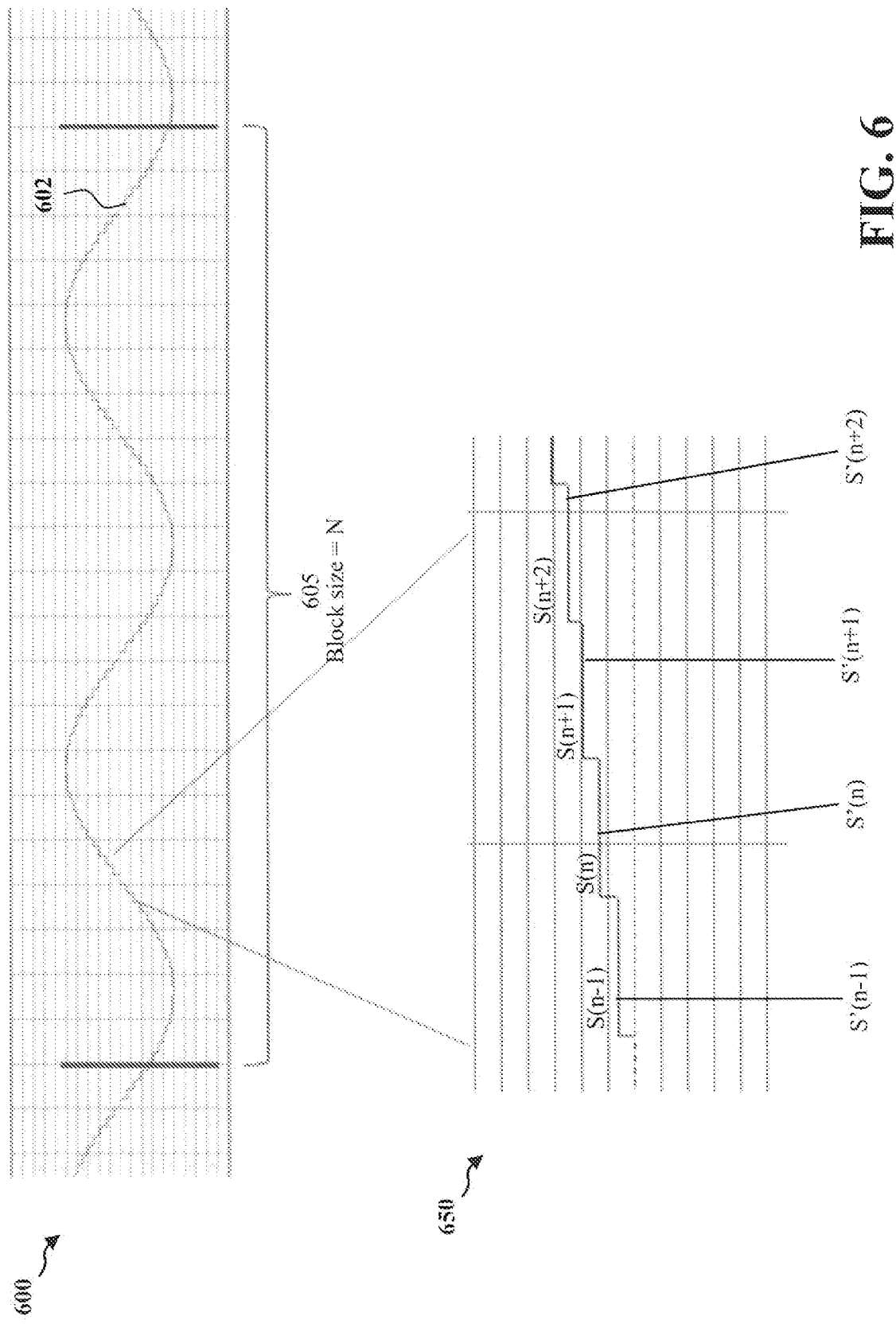
FIG. 6 illustrates an example of an efficient and effective method to resample an audio signal.

FIG. 6 illustrates an example of an efficient and effective method to resample an audio signal 602. As shown in diagram 600, a block size N may be chosen to be the working size of resampling the audio signal 602. Consequentially, the audio signal 602 may be divided into several blocks, each of which has N samples originally. The method may resample N samples of a block (e.g., block 605) into N−1 samples when audio playback overrun happens, whereas the method may resample N samples of a block into N+1 samples when audio playback underrun happens.

The diagram 650 shows a blow-up view of a portion of the block 605. The portion of the block 605 may include samples S(n−1), S(n), S(n+1), and S(n+2). As illustrated, the samples S(n−1), S(n), S(n+1), and S(n+2) may be resampled into samples S'(n−1), S'(n), S'(n+1), and S'(n+2).

Figure 7:
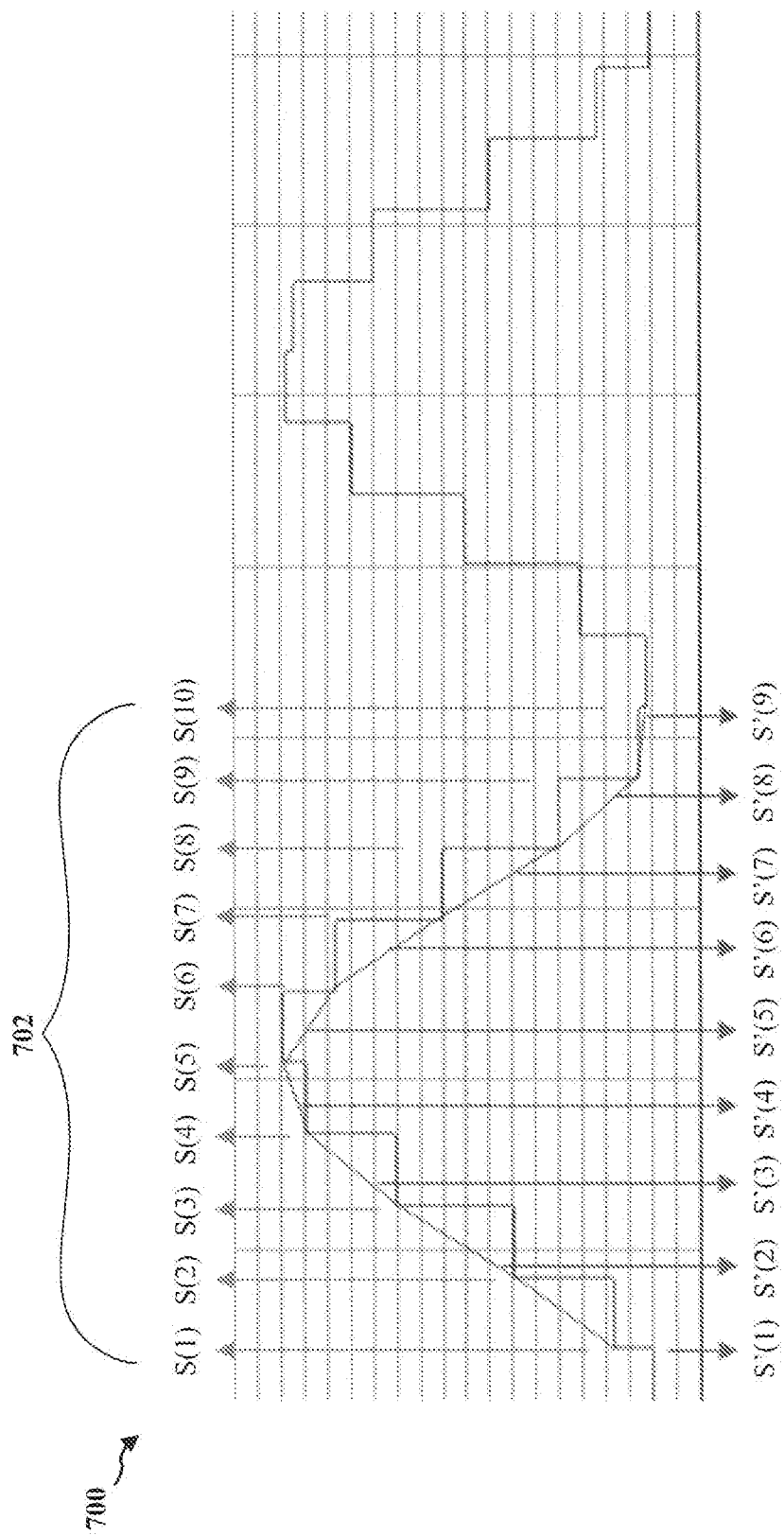
FIG. 7 is a diagram illustrating an example of resampling a block of audio signal.

FIG. 7 is a diagram 700 illustrating an example of resampling a block 702 of audio signal. In the example, the block size is 10, which means the block 702 originally has 10 samples. S(n) represents the nth sample of the original audio signal, whereas S'(n) represents the nth sample of the new audio signal which is resampled at an even interval. In the sample, the 10 original samples of the block 702 is resampled into 9 samples due to audio playback overrun.

In one embodiment, each original sample of the block 702 may be sliced into 1024 sub-samples. As a result, the time between two consecutive sub-samples in the time domain is much shorter than the time between two consecutive samples in the time domain. In one embodiment, the slicing of the each original sample may include obtaining a linear interpolation on the sample and a next sample immediately subsequent to the sample, and the 1024 sub-samples may be evenly distributed on the linear interpolation. The resample of the block 702 may be calculated by:

$$S'(1)=S(1)$$

$$S'(2)=S(2)+((S(3)-S(2))/1024)*113$$

$$S'(3)=S(3)+((S(4)-S(3))/1024)*227$$

$$S'(4)=S(4)+((S(5)-S(4))/1024)*341$$

$$S'(5)=S(5)+((S(6)-S(5))/1024)*455$$

$$S'(6)=S(6)+((S(7)-S(6))/1024)*568$$

$$S'(7)=S(7)+((S(8)-S(7))/1024)*682$$

$$S'(8)=S(8)+((S(9)-S(8))/1024)*796$$

$$S'(9)=S(9)+((S(10)-S(9))/1024)*910,$$

In one embodiment, the number of sub-samples associated with an original sample may be a power of 2 (e.g., 1024). In such an embodiment, division of 1024 in the calculation above may be replaced by arithmetic right shift of the exponent number of bits (e.g., 10 bits).

Figure 8:
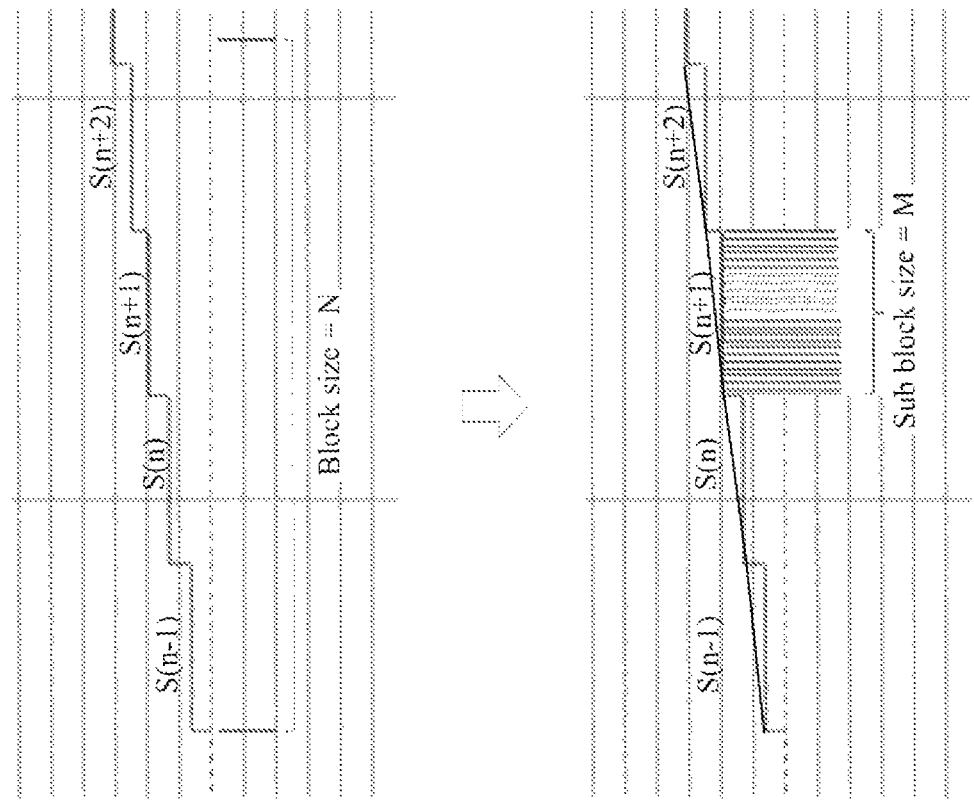
FIG. 8 illustrates a method of resampling audio signal in accordance with some embodiments of the disclosure.

FIG. 8 illustrates a method of resampling audio signal in accordance with some embodiments of the disclosure. At 800, a data block of size N is selected to perform resampling. At 850, the audio signal between sample(n) and sample(n+1) is sliced into M sub-sample, thus forming N×M sub-samples for the data block. In one embodiment, M may be chosen to be a number which is a power of 2, so that arithmetic shift operation instead of division can be used to obtain the final result of resampling. Such an embodiment may reduce the number of computational cycles for the resampling of audio signal.

If audio playback overrun happens, the new sample value may be computed by picking N−1 samples from the N×M sub-samples. If audio playback underrun happens, the new sample value may be computed by picking N+1 samples from the N×M sub-samples.

In one embodiment, a look up table may be constructed to shorten the processing time for the resampling of audio signal. In such an embodiment, the following software program may be used to construct the look up table.

```
// down
int I;
double fl, fn;
fl = N * M;
    for (int i=0; i < (N-1); i++)
    {
        fn = (fl / (N-1)) * i;
        fi = round(fn);
        decimate_samp_index[i][0] = fi / M;
        decimate_samp_index[i][1] = fi % M;
    }
// up
fl = N * M;
for (i=0; i < (N+1); i++)
{
    fn = (fl / (N+1)) * i;
    fi = round(fn);
    interpolate_samp_index[i][0] = fi / M;
    interpolate_samp_index[i][1] = fi % M;
}
```

The look up table may provide the sub-sample indexes that may need to be selected for the resampling of the audio signal. These sub-sample indexes may be used in the resampling calculation described above with reference to FIG. 7.

An example of the look up table constructed for N=10, M=1024 is illustrated below:

| Sample Index | Sub-Sample Index |
|---|---|
| 0 | 0 |
| 1 | 113 |
| 2 | 227 |
| 3 | 341 |
| 4 | 455 |
| 5 | 568 |
| 6 | 682 |
| 7 | 796 |
| 8 | 910 |

Below is an example of a software program that may be used to resample the audio signal based on a look up table.

```
p = output_audio_buf;           /// pointer to output audio buffer
q = input_audio_buf;            /// pointer to input audio buffer
p_ind = index_table;            /// pointer to index table
for (i=0; i<N; i++)
{
    ind = *p_ind++;             /// locate the main sample index
    d = q[ind];                 /// retrieve the original sample from index (ind)
    if (*p_ind != 0)            /// if sub index is needed
    {
        n = q[ind + 1] − q[ind]; // find the difference between S(n) & S(n+1)
        n = n * *p_ind++;       // find the value at the sub index
        n = n >> M;             // normalize the value
        d = d + n;              // add the value at sub index to main index
    }
    else
        p_ind++;
    *p++ = d;                   // store the resampled value
}
```

Figure 9:
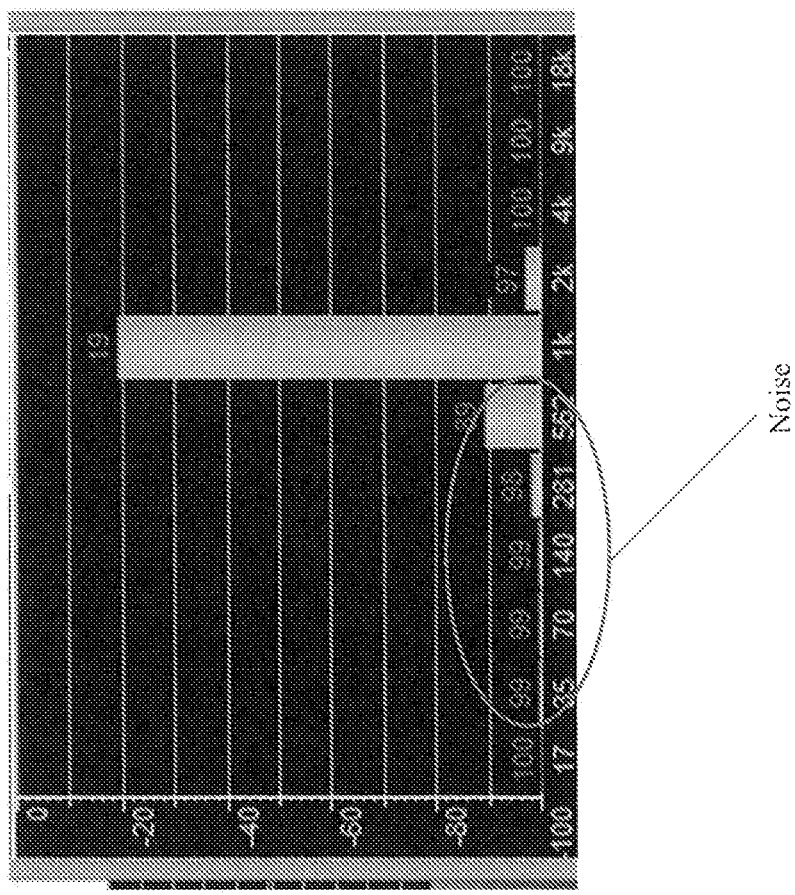
FIG. 9 is a diagram illustrating the frequency response of a resampled audio playback signal.

FIG. 9 is a diagram 900 illustrating the frequency response of a resampled audio playback signal. As shown, the signal-to-noise ratio of the resampled audio playback signal is close to the signal-to-noise ratio of the original signal, as illustrated above in FIG. 3. Noise level of the resampled audio playback signal is much lower compared to the distorted audio signal, as illustrated above in FIG. 5.

Figure 10:
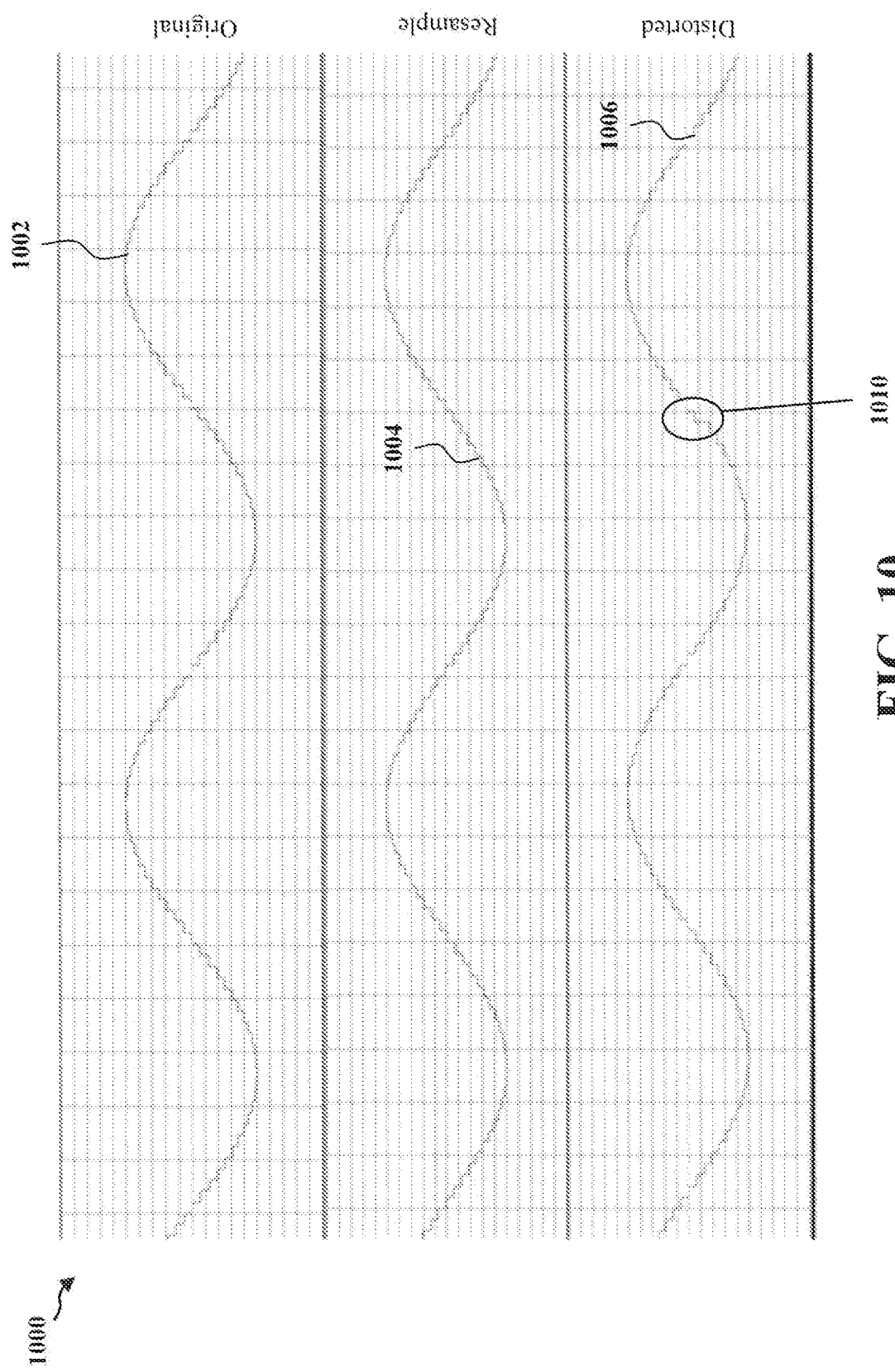
FIG. 10 is a diagram illustrating the comparison of the audio waveform among the original, resampled and the distorted signal.

By using the resampling method described above, the impact of audio playback underrun and overrun may be reduced by eliminating sudden popping or cracking sound due to the discontinuity of audio signal. FIG. 10 is a diagram 1000 illustrating the comparison of the audio waveform among the original, resampled and the distorted signal. As shown, any pair of consecutive samples of the waveform 1002 of the original signal transits smoothly from one sample of the pair to the other sample of the pair. Similarly, any pair of consecutive samples of the waveform 1004 of the resampled signal transits smoothly from one sample of the pair to the other sample of the pair. However, there is a disjoint section 1010 on the waveform 1006 of the distorted signal, which is obtained without using the resampling technique described in the disclosure. As a result, the signal resampled using the method described in the disclosure provides higher audio playback quality than the distorted signal.

Figure 11:
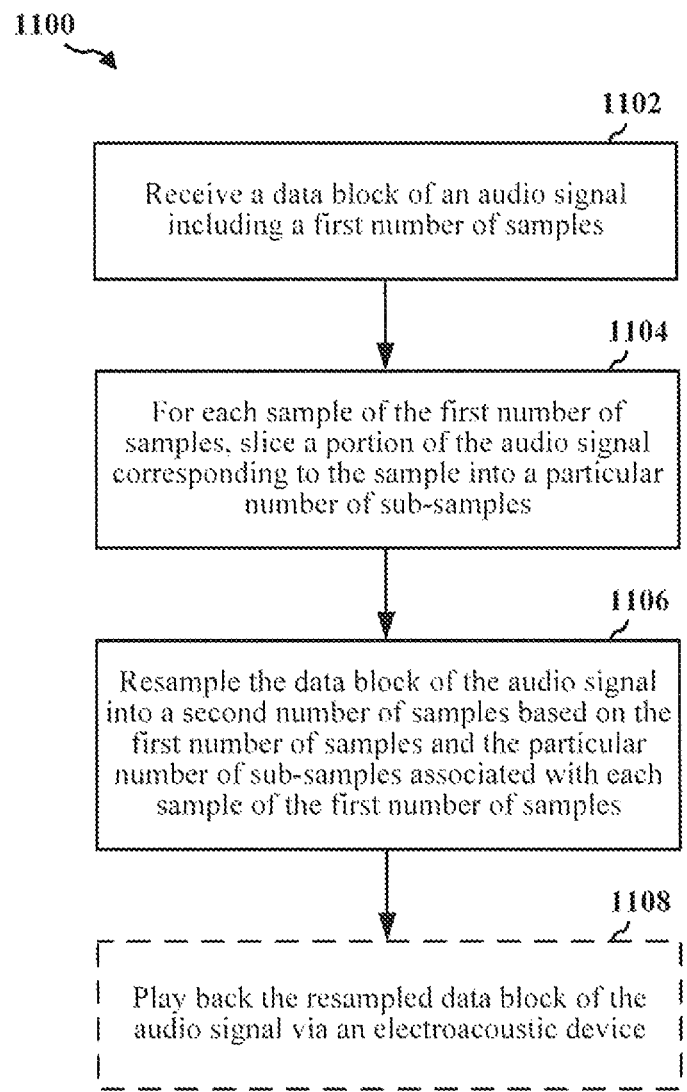
FIG. 11 is a flowchart of a method of resampling audio signal.

FIG. 11 is a flowchart 1100 of a method of resampling audio signal. In one embodiment, the method may be performed by an apparatus (e.g., the apparatus 1202/1202'). The apparatus may include a receiver device (e.g., the receiver device 110). In one embodiment, the method may perform the operations described above with reference to 106 in FIG. 1. In one embodiment, the method may perform the operations described above with reference to FIGS. 6-8.

At 1102, the apparatus may receive a data block of an audio signal including a first number of samples. The audio signal may be received wirelessly from a host device (e.g., the host device 102).

At 1104, for each sample of the first number of samples, the apparatus may slice a portion of the audio signal corresponding to the sample into a particular number of sub-samples. In one embodiment, the portion of the audio signal corresponding to the sample may be a portion of the audio signal between the sample and the next sample immediately subsequent to the sample. In such an embodiment, to slice the portion of the audio signal corresponding to the sample into the particular number of sub-samples, the apparatus may obtain a linear interpolation on the sample and the next sample. The particular number of sub-samples may be evenly distributed on the linear interpolation.

At 1106, the apparatus may resample the data block of the audio signal into a second number of samples based on the first number of samples and the particular number of sub-samples associated with each sample of the first number of samples. In one embodiment, the particular number may be a power of 2. In one embodiment, arithmetic shift operations may be used instead of division operations in the resampling of the data block.

In one embodiment, to resample the data block of the audio signal into the second number of samples, the apparatus may select the second number of samples based on the total number of sub-samples within the data block. The total number may be equal to the multiplication of the first number and the particular number. In one embodiment, the second number of samples may be evenly distributed within the total number of sub-samples. In one embodiment, the second number may be equal to the first number plus one. In another embodiment, the second number may be equal to the first number minus one.

At 1108, the apparatus may optionally play back the resampled data block of the audio signal via an electroacoustic device. In one embodiment, the electroacoustic device may be a speaker, a headphone, an earphone, etc.

Figure 12:
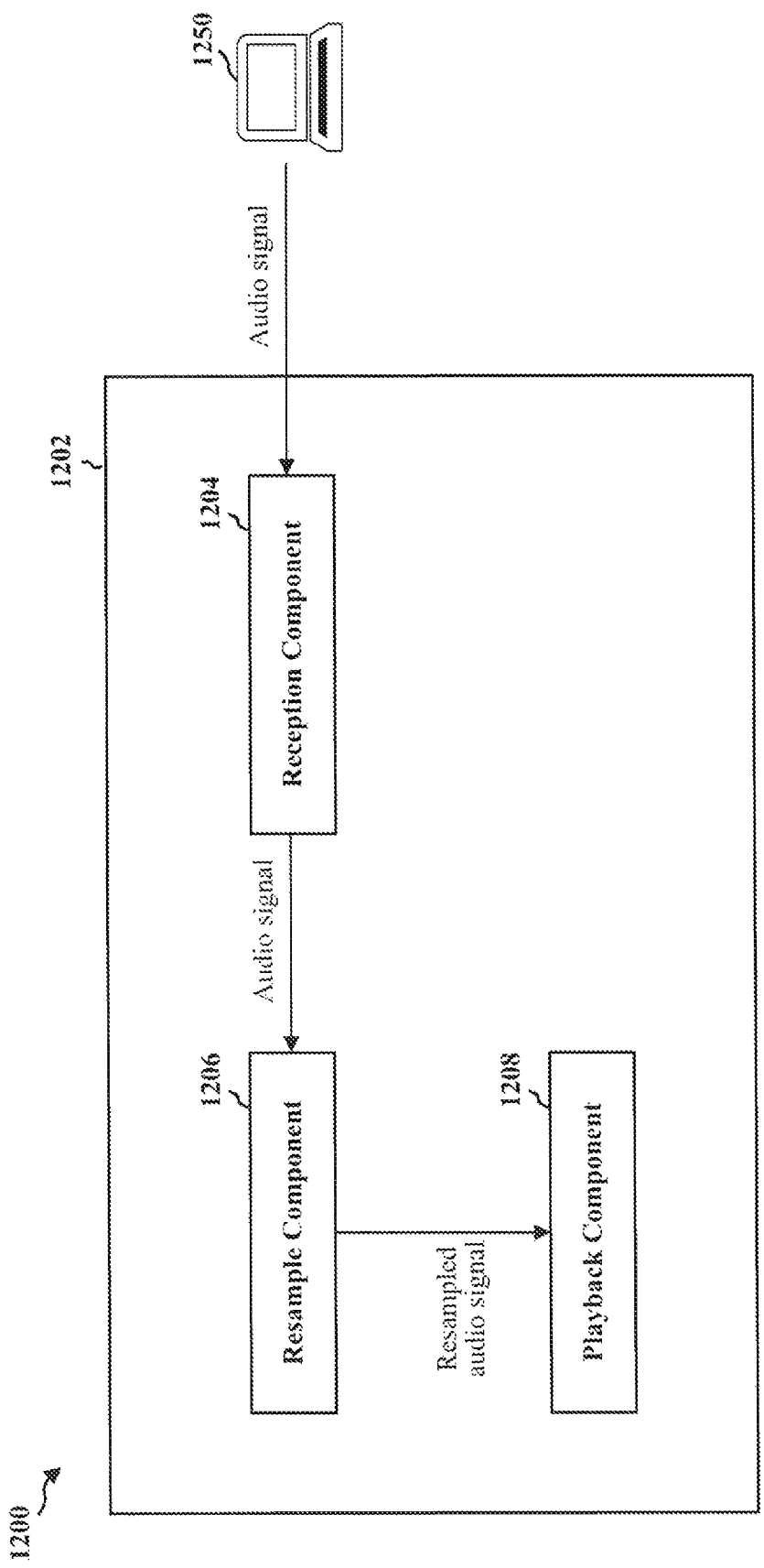
FIG. 12 is a conceptual data flow diagram illustrating the data flow between different means/components in an exemplary apparatus.

FIG. 12 is a conceptual data flow diagram 1200 illustrating the data flow between different means/components in an exemplary apparatus 1202. In one embodiment, the apparatus 1202 may include the receiver device 110 described above in FIG. 1.

The apparatus 1202 may include a reception component 1204 that receives audio signal from a host device 1250. In one embodiment, the host device 1250 may be the host device 102 described above in FIG. 1. In one embodiment, the reception component 1204 may perform the operations described above with reference to 1102 in FIG. 11.

The apparatus 1202 may include a resample component 1206 that resample the received audio signal to preserve the audio playback quality when dealing with audio playback overrun and underrun problem. In one embodiment, the resample component 1206 may perform the operations described above with reference to 1104 or 1106 in FIG. 11.

The apparatus 1202 may include a playback component 1208 that plays back the resampled audio signal. In one embodiment, the playback component 1208 may perform the operations described above with reference to 1108 in FIG. 11.

The apparatus 1202 may include additional components that perform each of the blocks of the algorithm in the aforementioned flowchart of FIG. 11. As such, each block in the aforementioned flowchart of FIG. 11 may be performed by a component and the apparatus may include one or more of those components. The components may be one or more hardware components specifically configured to carry out the stated processes/algorithm, implemented by a processor configured to perform the stated processes/algorithm, stored within a computer-readable medium for implementation by a processor, or some combination thereof.

Figure 13:
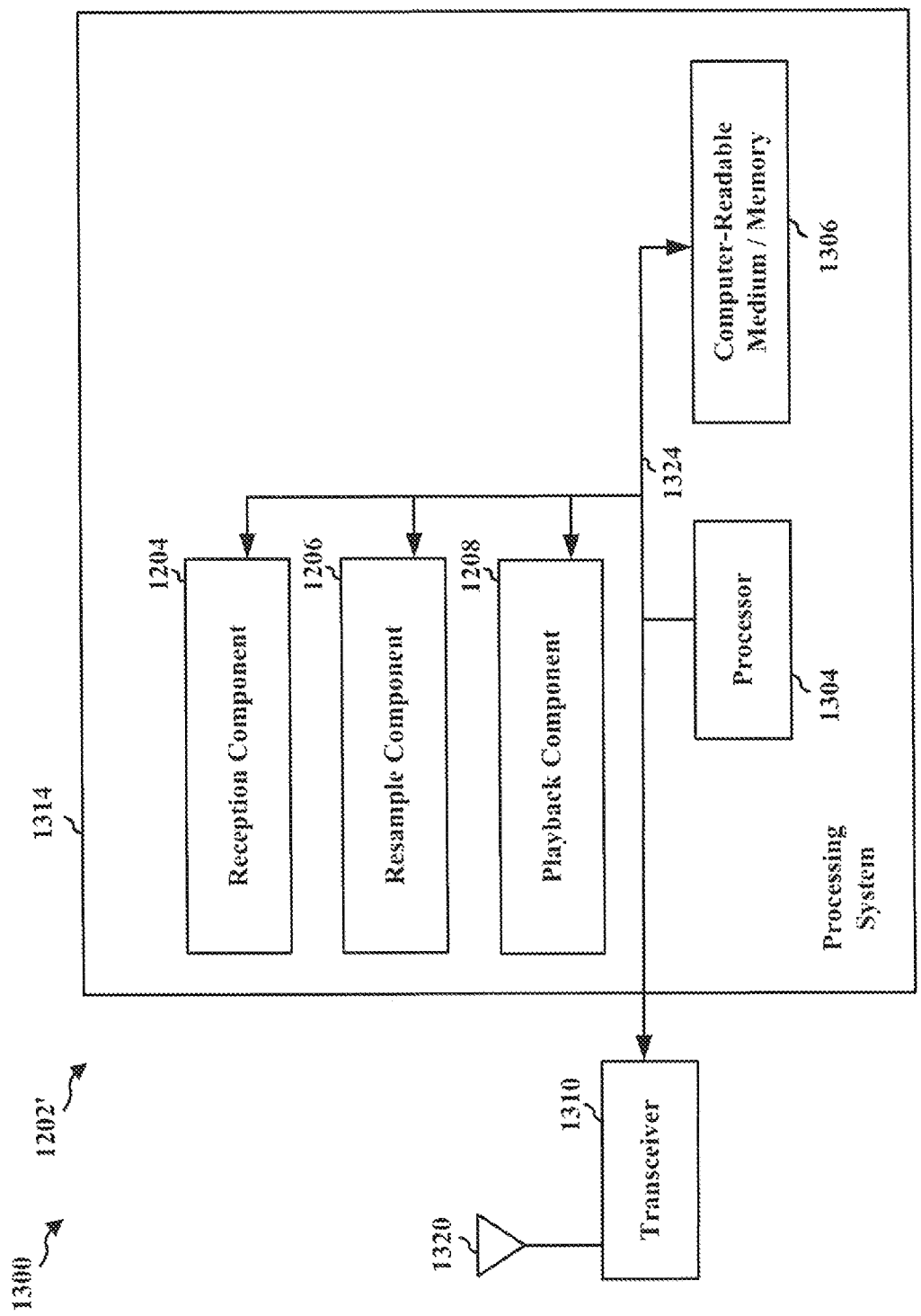
FIG. 13 is a diagram illustrating an example of a hardware implementation for an apparatus employing a processing system.

FIG. 13 is a diagram 1300 illustrating an example of a hardware implementation for an apparatus 1202' employing a processing system 1314. In one embodiment, the apparatus 1202' may be the apparatus 1202 described above with reference to FIG. 12. The processing system 1314 may be implemented with a bus architecture, represented generally by the bus 1324. The bus 1324 may include any number of interconnecting buses and bridges depending on the specific application of the processing system 1314 and the overall design constraints. The bus 1324 links together various circuits including one or more processors and/or hardware components, represented by the processor 1304, the components 1204, 1206, 1208, and the computer-readable medium/memory 1306. The bus 1324 may also link various other circuits such as timing sources, peripherals, voltage regulators, and power management circuits, which are well known in the art, and therefore, will not be described any further.

The processing system 1314 may be coupled to a transceiver 1310. The transceiver 1310 is coupled to one or more antennas 1320. The transceiver 1310 provides a means for communicating with various other apparatus over a transmission medium. The transceiver 1310 receives a signal from the one or more antennas 1320, extracts information from the received signal, and provides the extracted information to the processing system 1314, specifically the reception component 1304.

The processing system 1314 includes a processor 1304 coupled to a computer-readable medium/memory 1306. The processor 1304 is responsible for general processing, including the execution of software stored on the computer-readable medium/memory 1306. The software, when executed by the processor 1304, causes the processing system 1314 to perform the various functions described supra for any particular apparatus. The computer-readable medium/memory 1306 may also be used for storing data that is manipulated by the processor 1304 when executing software. The processing system 1314 further includes at least one of the components 1204, 1206, 1208. The components may be software components running in the processor 1304, resident/stored in the computer readable medium/memory 1306, one or more hardware components coupled to the processor 1304, or some combination thereof.

In the following, various aspects of this disclosure will be illustrated:

Example 1 is a method or apparatus for audio signal processing. The apparatus may receive a data block of an audio signal including a first number of samples. For each sample of the first number of samples, the apparatus may slice a portion of the audio signal corresponding to the sample into a particular number of sub-samples. The apparatus may resample the data block of the audio signal into a second number of samples based on the first number of samples and the particular number of sub-samples associated with each sample of the first number of samples.

In Example 2, the subject matter of Example 1 may optionally include that the apparatus may play back the resampled data block of the audio signal via an electroacoustic device.

In Example 3, the subject matter of any one of Examples 1 to 2 may optionally include that the particular number is a power of 2.

In Example 4, the subject matter of Example 3 may optionally include that arithmetic shift operations may be used instead of division operations in the resampling of the data block.

In Example 5, the subject matter of any one of Examples 1 to 4 may optionally include that, to resample the data block of the audio signal into the second number of samples, the apparatus may select the second number of samples based on the total number of sub-samples within the data block, where the total number is a multiplication of the first number and the particular number.

In Example 6, the subject matter of Example 5 may optionally include that the second number of samples may be evenly distributed within the total number of sub-samples.

In Example 7, the subject matter of any one of Examples 1 to 6 may optionally include that the second number is equal to the first number plus one.

In Example 8, the subject matter of any one of Examples 1 to 6 may optionally include that the second number is equal to the first number minus one.

In Example 9, the subject matter of any one of Examples 1 to 8 may optionally include that the portion of the audio signal corresponding to the sample may be a portion of the audio signal between the sample and the next sample immediately subsequent to the sample.

In Example 10, the subject matter of Example 9 may optionally include that, to slice the portion of the audio signal corresponding to the sample into the particular number of sub-samples, the apparatus may obtain a linear interpolation on the sample and the next sample, where the particular number of sub-samples are evenly distributed on the linear interpolation.

A person skilled in the art will appreciate that the terminology used herein is for the purpose of describing various embodiments only and is not intended to be limiting of the present invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It is understood that the specific order or hierarchy of blocks in the processes/flowcharts disclosed is an illustration of exemplary approaches. Based upon design preferences, it is understood that the specific order or hierarchy of blocks in the processes/flowcharts may be rearranged. Further, some blocks may be combined or omitted. The accompanying method claims present elements of the various blocks in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects. Unless specifically stated otherwise, the term "some" refers to one or more. Combinations such as "at least one of A, B, or C," "one or more of A, B, or C," "at least one of A, B, and C," "one or more of A, B, and C," and "A, B, C, or any combination thereof" include any combination of A, B, and/or C, and may include multiples of A, multiples of B, or multiples of C. Specifically, combinations such as "at least one of A, B, or C," "one or more of A, B, or C," "at least one of A, B, and C," "one or more of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. The words "module," "mechanism," "element," "device," and the like may not be a substitute for the word "means." As such, no claim element is to be construed as a means plus function unless the element is expressly recited using the phrase "means for."

What is claimed is:

1. A method of audio signal processing, the method comprising:
   receiving a data block of an audio signal comprising a first number of samples;
   for each sample of the first number of samples, slicing a portion of the audio signal corresponding to the sample into a particular number of sub-samples;
   obtaining a total number of sub-samples within the data block based on a multiplication of the first number with the particular number;
   resampling the data block of the audio signal into a second number of samples that is equal to the first number plus one, when an underrun condition occurs in an electroacoustic device, or to the first number minus one, when an overrun condition occurs in the electroacoustic device;
   distributing the second number of samples evenly within the total number of sub-samples obtained such that a duration corresponding to the second number of samples is equal to a duration corresponding to the first number of samples, the first number of samples and the second number of samples having been derived from the same data block; and
   playing back the resampled data block of the audio signal via the electroacoustic device.

2. The method of claim 1, wherein the particular number is a power of 2.

3. The method of claim 2, wherein arithmetic shift operations of an exponent number of bits of the data block are used instead of division operations in the resampling of the data block.

4. The method of claim 1, wherein the portion of the audio signal corresponding to the sample is a portion of the audio signal between the sample and a next sample immediately subsequent to the sample.

5. The method of claim 4, wherein the slicing the portion of the audio signal corresponding to the sample into the particular number of sub-samples comprises obtaining a linear interpolation on the sample and the next sample, wherein the particular number of sub-samples are evenly distributed on the linear interpolation.

6. The method of claim 1, wherein the first number is equal to 10.

7. The method of claim 6, wherein the particular number is equal to 1024.

8. An apparatus for audio signal processing, the apparatus comprising:
a memory; and
at least one processor coupled to the memory and configured to:
receive a data block of an audio signal comprising a first number of samples;
for each sample of the first number of samples, slice a portion of the audio signal corresponding to the sample into a particular number of sub-samples;
obtain a total number of sub-samples within the data block based on a multiplication of the first number with the particular number; and
resample the data block of the audio signal into a second number of samples that is equal to the first number plus one, when an underrun condition occurs in an electroacoustic device, or to the first number minus one, when an overrun condition occurs in the electroacoustic device;
distribute the second number of samples evenly within the total number of sub-samples obtained such that a duration corresponding to the second number of samples is equal to a duration corresponding to the first number of samples, the first number of samples and the second number of samples having been derived from the same data block; and
play back the resampled data block of the audio signal via the electroacoustic device.

9. The apparatus of claim 8, wherein the particular number is a power of 2.

10. The apparatus of claim 9, wherein arithmetic shift operations of an exponent number of bits of the data block are used instead of division operations in the resampling of the data block.

11. The apparatus of claim 8, wherein the portion of the audio signal corresponding to the sample is a portion of the audio signal between the sample and a next sample immediately subsequent to the sample.

12. The apparatus of claim 11, wherein, to slice the portion of the audio signal corresponding to the sample into the particular number of sub-samples, the at least one processor is configured to obtain a linear interpolation on the sample and the next sample, wherein the particular number of sub-samples are evenly distributed on the linear interpolation.

13. A non-transitory computer-readable medium storing computer executable code, comprising instructions for:
receiving a data block of an audio signal comprising a first number of samples; for each sample of the first number of samples, slicing a portion of the audio signal corresponding to the sample into a particular number of sub-samples;
obtaining a total number of sub-samples within the data block based on a multiplication of the first number with the particular number; and
resampling the data block of the audio signal into a second number of samples that is equal to the first number plus one, when an underrun condition occurs in an electroacoustic device, or to the first number minus one, when an overrun condition occurs in the electroacoustic device;
distributing the second number of samples evenly within the total number of sub-samples obtained such that a duration corresponding to the second number of samples is equal to a duration corresponding to the first number of samples, the first number of samples and the second number of samples having been derived from the same data block; and
playing back the resampled data block of the audio signal via the electroacoustic device.

14. The non-transitory computer-readable medium of claim 13, wherein the particular number is a power of 2.

15. The non-transitory computer-readable medium of claim 13, wherein the portion of the audio signal corresponding to the sample is a portion of the audio signal between the sample and a next sample immediately subsequent to the sample, wherein the slicing the portion of the audio signal corresponding to the sample into the particular number of sub-samples comprises obtaining a linear interpolation on the sample and the next sample, wherein the particular number of sub-samples are evenly distributed on the linear interpolation.

* * * * *